(12) United States Patent
Chon et al.

(10) Patent No.: US 7,724,061 B2
(45) Date of Patent: May 25, 2010

(54) ACTIVE CLAMP CIRCUIT FOR ELECTRONIC COMPONENTS

(75) Inventors: Won Chon, Torrance, CA (US); Nick J. Rosik, Redondo Beach, CA (US); Harry H. Kim, Cerritos, CA (US); Gregory D. Surbeck, Oxford, MS (US); Gharib Gharibianians, Tustin, CA (US); Dean W. Schoettler, Rancho Palos Verdes, CA (US)

(73) Assignee: Raytheon Company, Waltham, MA (US)

( * ) Notice: Subject to any disclaimer, the term of this patent is extended or adjusted under 35 U.S.C. 154(b) by 71 days.

(21) Appl. No.: 11/981,196

(22) Filed: Oct. 31, 2007

(65) Prior Publication Data

US 2009/0110117 A1 Apr. 30, 2009

(51) Int. Cl.
*H03L 5/00* (2006.01)

(52) U.S. Cl. ...................................... 327/320; 327/309

(58) Field of Classification Search .......... 327/309–325
See application file for complete search history.

(56) References Cited

U.S. PATENT DOCUMENTS 4,808,944 A * 2/1989 Taylor ........................ 330/253
5,896,177 A * 4/1999 Hwang ....................... 348/445

6,191,725 B1 2/2001 Lavoie
7,088,794 B2 8/2006 Nichols

FOREIGN PATENT DOCUMENTS

JP 1993-237157 * 6/1993

* cited by examiner

*Primary Examiner*—Dinh T. Le
(74) *Attorney, Agent, or Firm*—Christie, Parker & Hale, LLP

(57) ABSTRACT

An active clamp circuit for electronic components includes two sets of diode connected transistors that are inversely connected in parallel across an output of the component for providing both positive and negative differential conducting paths. The diode connected transistors cooperatively operate to limit a differential output voltage between the positive and negative conducting paths. An emitter follower buffer includes the clamp circuit and is configured to limit RF energy incident to an analog to digital converter (ADC). The emitter follower buffer includes two input transistors having their emitters each connected to at least one diode connected transistor connected to the clamp circuit. A receiver includes the differential amplifier and an analog to digital converter. A method for limiting the energy of analog signals in the receiver includes the step of operating the clamp circuit to limit the analog signals transmitted to the analog to digital converter (ADC).

32 Claims, 2 Drawing Sheets

ACTIVE CLAMP CIRCUIT FOR ELECTRONIC COMPONENTS

FIELD

This invention relates generally to the field of analog to digital converters (ADCs), and more specifically to active clamp circuits.

BACKGROUND

Analog to digital converters (ADC's) are used in various electronic systems for converting analog signals to corresponding digital signals. An analog signal is any variable signal continuous in both time and amplitude, whereas a digital signal is represented by a series of data bits such as logical "0" and "1". With analog signals, small fluctuations in the signal can imply meaning, but they may also be simply noise. With repeated transmission, duplication and processing noise elements can inadvertently become dominant. Translation of the analog signal to a digital signal can achieve both high fidelity and perfect reproduction capability and, as such, is often highly desirable.

One type of analog to digital converter (ADC) called a delta-sigma ADC (also known as a sigma-delta ADC) subtracts a feedback signal from the analog input signal to provide an error signal. The error signal is then quantified and filtered to form a digital output signal.

High-resolution analog to digital converters (ADC) are used in radar, missile and communication systems. For example, in receivers for radar systems, RF signals are down-converted to an intermediate frequency (IF), which are then fed into an analog to digital converter (ADC) for conversion into digital signals.

One problem with analog to digital converters (ADCs) is that large input signals can cause oscillation, or limit cycling, in the digital output signals, which can shut down the entire system. For example, in a radar receiver, large input signals (e.g., co-channel interference, large main bang leakage due to mistimed bases, or bright close range targets with improper gain control) can cause the analog to digital converter (ADC) to oscillate. The analog to digital converter (ADC) can remain in this state (i.e., oscillation of the digital output signals) indefinitely, or until another strong input signal initiates a normal operational state.

In order to alleviate oscillation, gain control circuits can be used to detect and process signals that are outside of an acceptable signal strength. For example, U.S. Pat. No. 7,088,794 to Nichols, and U.S. Pat. No. 6,191,725 to Lavoie disclose radar systems having gain control circuits. Another approach to this problem involves changing the architecture of the analog to digital converter (ADC) to suppress limit cycles.

Unfortunately neither of these approaches has achieved completely satisfactory results. A particular shortcoming is a significant degradation in receiver dynamic range.

Hence there is a need for a circuit that overcomes one or more of the technical problems as stated above.

SUMMARY

This invention provides a clamp circuit for limiting energy to certain electronic components including, but not limited to, receivers such as may be found in radar and communication systems.

In particular, and by way of example only, according to one embodiment of the present invention, provided is an active clamp circuit for an electronic component including two sets of diode connected transistors connected in inverse parallel across an output of the component for providing a positive conducting path and a negative conducting path between two conductive lines of the component output. The sets of diode connected transistors cooperatively operate to limit a differential voltage between the positive conducting path and the negative conducting path provided to the following electronic component. Each set of diode connected transistors is configured to clamp its associated current path in response to a differential voltage ($V_{out}$) at the output of the component being outside of a voltage range defined by $V_{clampn}$ and $V_{clampp}$. Thus, clamping is provided on a positive current path when the positive differential voltage ($V_{outp}$) of the output is greater than $V_{clampp}$. Likewise, clamping is provided on a negative current path when the negative differential voltage ($V_{outn}$) of the output is less than $V_{clampn}$. Prior to the positive differential voltage ($V_{outp}$) at the output reaching the clamping voltage ($V_{clampp}$), the diode connected transistors appear transparent and do not significantly affect the small signal linearity of the clamp circuit. A similar effect is found with respect to the negative current path. The clamping voltages ($V_{clampn}$ and $V_{clampp}$) are dependent upon turn-on voltages ($V_{Be}$) of the diode connected transistors, and on the number of transistors in each set.

In an illustrative embodiment, the electronic component comprises an emitter follower buffer in a differential configuration with a positive and negative differential conducting path. The differential emitter follower buffer includes positive and negative input transistors. Following the input transistors of each conducting path may be at least one diode configured transistor which is connected to the clamp circuit and adapted to shift down a voltage along its associated conducting path. The differential emitter follower buffer also includes positive and negative differential path current sources, and can optionally include an external attenuator for providing a non-discrete clamping voltage.

A method for limiting the energy of analog signals in a receiver includes the steps of providing an ADC in the receiver, providing a differential amplifier having an output connected to the ADC and a clamp circuit comprising diode connected transistors connected in inverse parallel, and then operating the clamp circuit to limit analog signals transmitted to the ADC. The method can also include the step of setting a clamping voltage ($V_{clamp}$) of the clamp circuit by selecting the number of diode connected transistors.

BRIEF DESCRIPTION OF THE DRAWINGS

Exemplary embodiments are illustrated in the referenced figures of the drawings. It is intended that the embodiments and the figures disclosed herein are to be considered illustrative rather than limiting.

DETAILED DESCRIPTION

Before proceeding with the detailed description, it is to be appreciated that the present teaching is by way of example only, not by limitation. The concepts herein are not limited to use or application with a specific type of adaptive clamp circuit or method of limiting energy in a circuit. Thus, although the instrumentalities described herein are for the convenience of explanation, shown and described with respect to exemplary embodiments, it will be appreciated that the principles herein may be applied equally in other types of clamp circuits and clamping methodologies.

To further assist in the following description, the following defined terms are provided.

As used herein, "transistor" is understood and appreciated to be a bipolar junction transistor (BJT) constructed using a conventional fabrication process, such as a silicon germanium (SiGe) fabrication process. The BJTs can have an NPN configuration, or a PNP configuration. In the description to follow the BJTs have three external terminals including: a base (B), a collector (C), and an emitter (E). The concepts described herein can be extended to the use of field effect transistors (FETs).

A "diode connected transistor" is understood and appreciated to be a BJT having two terminals shorted together to provide a diode configuration in which current is transmitted in only one direction.

Figure 1:
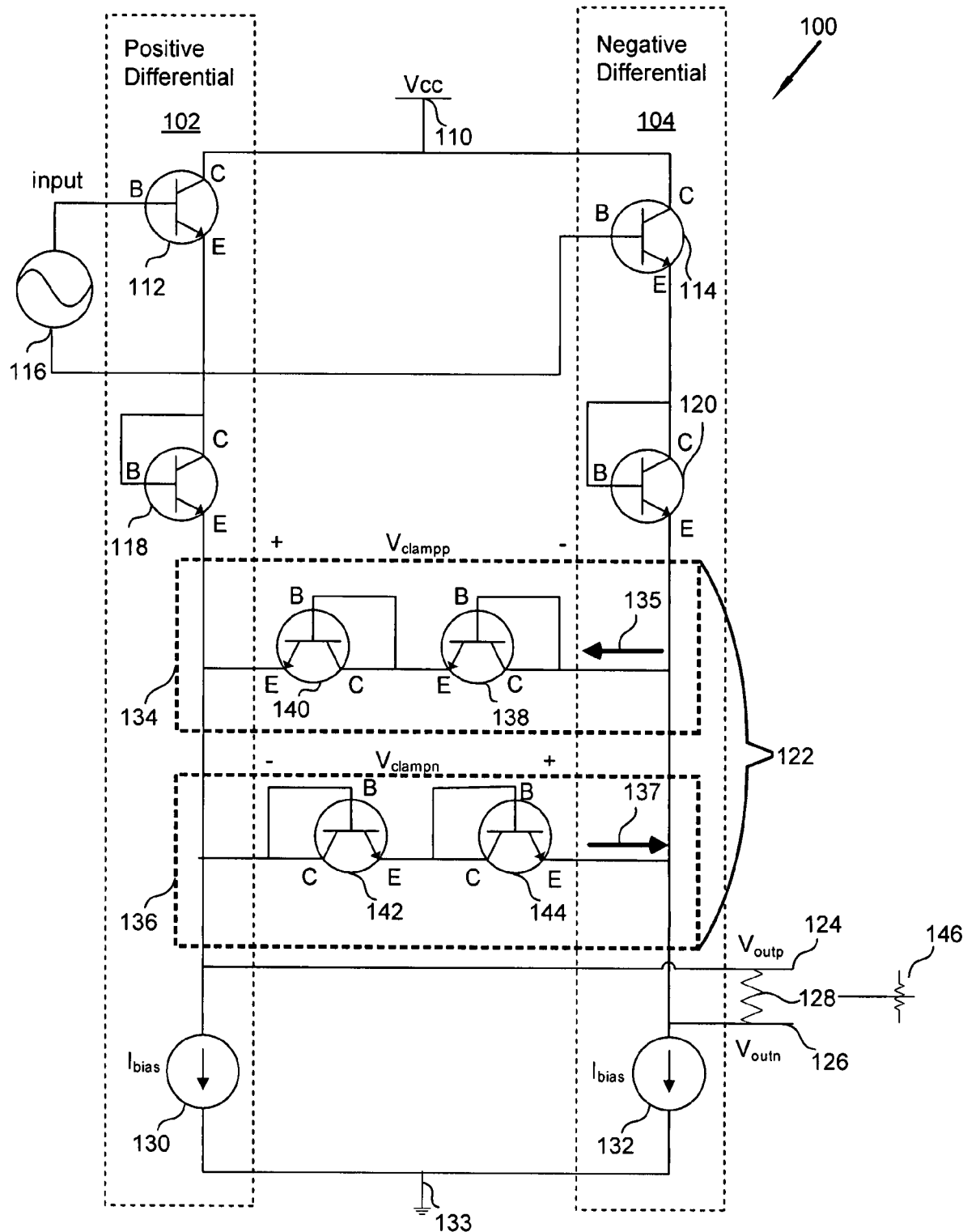
FIG. 1 is an electrical schematic of a differential emitter follower buffer having an active clamp circuit in accordance with at least one embodiment.

Referring to FIG. 1, an electronic component in the form of a differential emitter follower buffer 100 is illustrated. The differential emitter follower buffer 100 includes an NPN input transistor (112, 114) for both the positive 102 and negative 104 differential conducting paths. In at least one embodiment, the input transistors 112, 114 are NPN transistors having their bases (B) connected to an input source 116. The input source 116 is configured to provide analog input signals, such as intermediate frequency (IF) signals derived from RF signals. The collectors (C) of the input transistors 112, 114 are connected to Vcc 110.

The differential emitter follower buffer 100 (FIG. 1) also includes an output terminal 124 for the positive differential path 102, and an output terminal 126 for the negative differential path 104. A resistor 128 between the output terminals 124, 126 represents the differential output load. The differential emitter follower buffer 100 also includes a positive differential path bias current source 130 and negative differential path bias current source 132, both of which are denoted ($I_{bias}$). As shown in FIG. 1, the bias current sources 130, 132 are connected to ground 133.

The differential emitter follower buffer 100 (FIG. 1) also includes a positive differential path diode connected transistor 118 having its collector (C) connected to the emitter (E) of the NPN input transistor 112, and a negative differential path diode connected transistor 120 having its collector (C) connected to the emitter (E) of the NPN input transistor 114. The diode connected transistors 118, 120 have their bases (B) and their collectors (C) shorted together, such that the bases (B) receive the output from the input transistors 112, 114. Diode connected transistors 118, 120 are provided to shift down the voltage along the current path.

The emitter follower buffer 100 (FIG. 1) also includes a clamp circuit 122, which comprises a first set of diode connected transistors 134, and a second set of diode connected transistors 136 connected in inverse parallel across the output terminals 124, 126 of the emitter follower buffer 100. Diode connected transistors 138 and 140 provide a negative clamping path. Diode connected transistors 142 and 144 are connected in the opposite direction of diode connected transistors 138 and 140 to provide a positive clamping path.

In the clamp circuit 122 (FIG. 1), the negative conducting path (represented by arrow 135) of the first set of diode connected transistors 134 is inversely connected to the positive conducting path (represented by arrow 137) of the second set of diode connected transistors 136. This provides a current path through the first set of diode connected transistors 134 for a negative differential voltage 124 at the output, denoted ($V_{outp}$), and a current path through the second set of diode connected transistors 136 for a positive differential voltage 126 at the output, denoted ($V_{outn}$).

The clamping voltage ($V_{clamp}$) can be expressed as either a positive clamping voltage ($V_{clampp}$) or a negative clamping voltage ($V_{clampn}$). During operation of the clamp circuit 122, if the difference of the positive differential voltage 124 ($V_{outp}$) and the negative differential voltage 126 ($V_{out}$) has a value less than the positive clamping voltage ($V_{clampp}$), then the first diode connected transistor 142 and the second diode connected transistor 144 of the first set of diode connected transistors 136 are in an "OFF" state and appear transparent to positive conducting path 136. Thus, no clamping is provided on the positive conducting path 137. Similarly, if the difference of the negative differential voltage 126 ($V_{outn}$) and the positive differential voltage 124 ($V_{outp}$) has an absolute value less than that of a negative clamping voltage ($V_{clampn}$) (i.e., is less negative), then the first diode connected transistor 138 and the second diode connected transistor 140 of the second set of diode connected transistors 134 are in an "OFF" state and appear transparent to negative conducting path 135. Thus, no clamping is provided on the negative conducting path 135.

During operation of the clamp circuit 122, if the difference of the positive differential voltage at output terminal 124 ($V_{outp}$) and the negative differential voltage at output terminal 126 ($V_{outn}$) is greater than the positive clamping voltage ($V_{clampp}$), then the first diode connected transistor 142 and the second diode connected transistor 144 of the first set of diode connected transistors 136 are in an "ON" state and provide clamping on positive conducting path 137. Similarly, if the difference of the negative differential voltage at output terminal 126 ($V_{outn}$) and the positive differential voltage at output terminal 124 ($V_{outp}$) has an absolute value greater than that of the negative clamping voltage ($V_{clampn}$) (i.e., is less negative), then the first diode connected transistor 138 and the second diode connected transistor 140 of the second set of diode connected transistors 134 are in an "ON" state and provide clamping on the negative conducting path 135.

In the clamp circuit 122, the positive clamping voltage ($V_{clampp}$) is dependent on base-emitter turn-on voltages ($V_{Be}$) for the diode connected transistors 142, 144. The negative clamping voltage ($V_{clampn}$) is dependent on base-emitter turn-on voltages ($V_{Be}$) for the diode connected transistors 138, 140. Also in the clamp circuit 122, the positive clamping voltage ($V_{clampp}$) is a function of the number of diode connected transistors 142, 144, as it is derived from the sum of the base-emitter turn-on voltages ($V_{Be}$) of the diode connected transistors 142, 144. Similarly, the negative clamping voltage ($V_{clampn}$) is a function of the number of diode connected transistors 138, 140, as it is derived from the sum of the base-emitter turn-on voltages ($V_{Be}$) of the diode connected transistors 138, 140. Moreover, for each set 134 and 136 it is understood and appreciated that in at least one embodiment the number of diode connected transistors is two, as shown, however, in alternative embodiments a greater or lesser number may be employed. By way of example, the clamping voltage ($V_{clampp}$ or $V_{clampn}$) can be set at a selected voltage relative to the sum of the base-emitter turn-on voltages ($V_{Be}$) for the diode connected transistors 138, 140 or 142, 144 (e.g., $V_{clampp}$ or $V_{clampn}$ = sum of ($V_{Be}$)).

The minimum clamping voltage ($V_{clampp}$ or $V_{clampn}$) achievable by the clamp circuit 122 is attained when only a single diode connected transistor 138, 140, 142 or 144 is connected in series across the output terminals 124, 126. Similarly, the minimum clamping voltage ($V_{clamp}$) can be increased by increasing the number of diode connected transistors 138, 140, 142, 144. In the illustrative embodiment, each set of diode connected transistors 134, 136 has two diode connected transistors (138, 140) and (142, 144). However, it is to be understood that each set of diode connected transistors 134, 136 can have any number of diode connected transistors 138, 140, 142, 144 (e.g., from one to one hundred).

To briefly restate, the clamp circuit 122 comprises at least one first diode connected transistor (e.g., diode connected transistors 142, 144) structured and arranged to pass a first current along positive conducting path 137 between two conductive lines connected to output terminals 124, 126, and at least one second diode connected transistor (e.g., diode connected transistors 138, 140) structured and arranged to pass a second current along negative conducting path 135 opposite to the first direction. The diode connected transistors 142, 144 and the diode connected transistors 138, 140 cooperatively operate to adaptively limit a differential output voltage at output terminals 124 and 126 of emitter follower buffer 100 and clamp circuit 122.

Further, the diode connected transistors 142, 144 are configured to clamp the positive current path 137 responsive to the difference of the positive differential voltage 124 ($V_{outp}$) and negative differential voltage of the output being greater than a positive clamping voltage ($V_{clampp}$). The second diode connected transistors 138, 140 are configured to clamp the negative current path 135 responsive to the difference of the negative differential voltage 126 ($V_{outn}$) and the positive differential voltage 124 ($V_{outp}$) of the output being less than that of a negative clamping voltage ($V_{clampn}$). The positive clamping voltage ($V_{clampp}$) is dependent upon turn-on voltages ($V_{Be}$) of the diode connected transistors 142, 144, and the negative clamping voltage ($V_{clampn}$) is dependent upon turn-on voltages ($V_{Be}$) of the diode connected transistors 138, 140.

Optionally, in at least one embodiment, a non-discrete clamping voltage ($V_{clampp}$ or $V_{clampn}$) can be obtained by placing an external attenuator 146 in electrical communication with the output terminals 124, 126. The diode connected transistors 138, 140, 142, 144 provide only discrete clamping voltages ($V_{clampp}$ and $V_{clampn}$), with the configurable discrete clamping voltage levels ($V_{clampp}$ and $V_{clampn}$) being dependent on the turn-on voltages of the diode connected transistors 138, 140, 142, 144. The external attenuator 146 may be configured to further reduce a clamped output differential voltage at output terminals 124, 126 such that a non-discrete clamping voltage is provided.

The clamp circuit 122 provides clamping similar to a conventional diode limiter but approaches an ideal diode response. In this regard, conventional diode limiters have a soft "knee" in which the voltage response through the limiter is not hard-clamped but is still non-linear. One such conventional diode limiter is a ring quad diode manufactured by Agilent Technologies of Santa Clara, Calif., designated as part number "HSMS-2817". In advantageous contrast to these types of conventional diode limiters, the present clamp circuit 122 (FIG. 1) has a much sharper clamp knee, and significantly reduced small signal suppression over its operating range, thereby recovering any lost dynamic range. Further, the circuit topology of the clamp circuit (FIG. 1) is flexible, in that it can be configured to clamp over a range of discrete voltage levels in steps of diode drops by adding or removing diode connected transistors 138, 140, 142, 144. Further, the external attenuator 146 (FIG. 1) can be used for clamp levels between the diode drops if needed.

Figure 2:
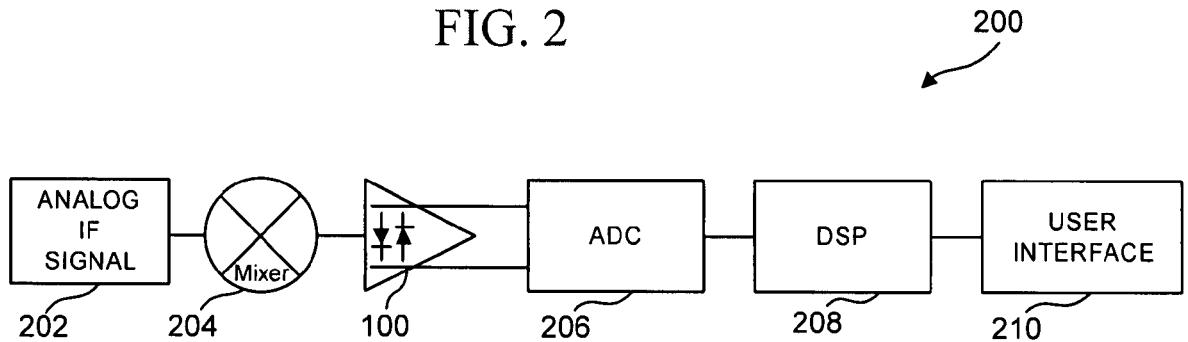
FIG. 2 is a block diagram of a receiver incorporating the differential emitter follower buffer illustrated in FIG. 1 in accordance with at least one embodiment.

Referring to FIG. 2, a receiver 200 incorporating the emitter follower buffer 100 (FIG. 1) is illustrated. In other embodiments, receiver 200 may comprise other types of radio receivers. The receiver may be of a type used in radio radar, communication and other types of electronic systems in which a clamping circuit may advantageously be employed. In at least one embodiment, the receiver is a radar receiver. The receiver 200 is configured to receive an analog RF input signal 202. By way of example, the RF input signal 202 can comprise a radar pulse converted to an intermediate frequency using techniques that are known in the art. The receiver 200 also includes a mixer 204 configured to downconvert the RF input signal 202 to an IF signal. The output of the mixer 204 is connected to the emitter follower buffer 100 having the clamp circuit 122 (FIG. 1) as previously described.

The receiver 200 (FIG. 2) also includes an analog to digital converter (ADC) 206 having its input connected to the output of the emitter follower buffer 100. The receiver 200 also includes a digital signal processor (DSP) 208 configured to receive the digital signals from the analog to digital converter (ADC) 206, and a graphical user interface 210 such as a display screen. During operation of the receiver 200 (FIG. 2) the emitter follower buffer 100 functions to limit IF energy to the ADC 206.

Figure 3:
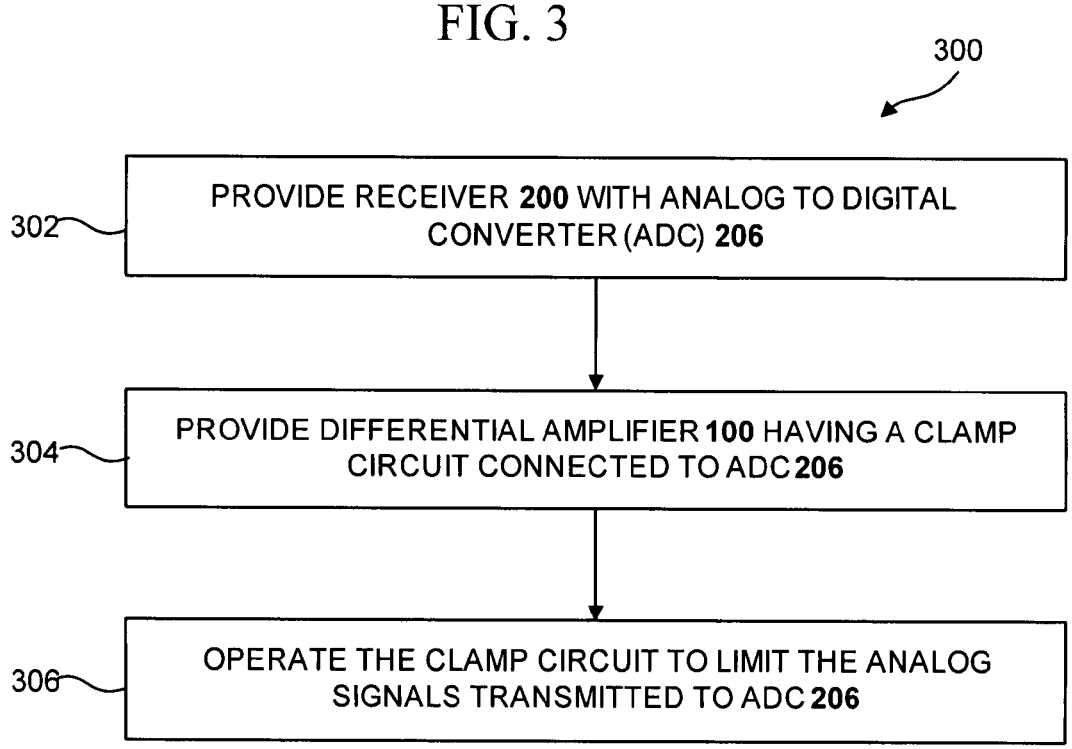
FIG. 3 is a block diagram illustrating steps in a method for limiting RF energy in the receiver in accordance with at least one embodiment.

FIG. 3 illustrates a method 300 in accordance with at least one embodiment for limiting the energy of analog signals transmitted to the ADC 206 of the receiver 200 (FIG. 2). It is also understood and appreciated that the disclosed method need not be performed in the order herein described, but that this order of description is exemplary of at least one embodiment and has been selected for ease of discussion and illustration.

The method 300 includes the steps of providing the receiver 200 with the ADC 206 (step 302), providing the emitter follower buffer 100 having the clamp circuit 122 connected to the ADC 206 (step 304), and then operating the clamp circuit 122 to limit the analog signals transmitted to the ADC 206 (step 306).

Changes may be made in the above methods, systems and structures without departing from the scope hereof. It should thus be noted that the matter contained in the above description and/or shown in the accompanying drawings should be interpreted as illustrative and not in a limiting sense. The following claims are intended to cover all generic and specific features described herein, as well as all statements of the scope of the present method, system and structure, which, as a matter of language, might be said to fall there between.

What is claimed is:

1. An active clamp circuit, comprising:
    a differential output adapted to provide a differential voltage between a positive differential path and a negative differential path;
    at least one first diode connected transistor adapted to pass a first current along a positive conducting path extending from the positive differential path to the negative differential path; and
    at least one second diode connected transistor adapted to pass a second current along a negative conducting path extending from the negative differential path to the positive differential path;
    wherein the at least one first diode connected transistor and the at least one second diode connected transistor are cooperatively operable to adaptively limit the differential voltage at the output; and
    wherein the differential output is in electrical communication with an analog to digital converter (ADC) configured to generate a digital signal representative of a magnitude of a differential analog output signal from the differential output.

2. The active clamp circuit of claim 1 further comprising:
a positive input transistor adapted to pass an input signal on the positive differential path; and
a negative input transistor adapted to pass the input signal on the negative differential path.

3. The active clamp circuit of claim 1, wherein the at least one first diode connected transistor is configured to clamp the first current responsive to a positive differential voltage of the output being greater than a positive clamping voltage ($V_{clampp}$).

4. The active clamp circuit of claim 3, wherein the positive clamping voltage ($V_{clampp}$) equals a sum of turn-on voltages ($V_{Be}$) of the at least one first diode connected transistor.

5. The active clamp circuit of claim 1, wherein the at least one second diode connected transistor is configured to clamp the second current responsive to a negative differential voltage of the output being less than a negative clamping voltage ($V_{clampn}$).

6. The active clamp circuit of claim 5, wherein the negative clamping voltage ($V_{clampn}$) equals a sum of turn-on voltages ($V_{Be}$) of the at least one second diode connected transistor.

7. The active clamp circuit of claim 1 further comprising:
at least one positive differential path diode connected transistor adapted to shift down a first voltage along the positive differential path; and
at least one negative differential path diode connected transistor adapted to shift down a second voltage along the negative differential path.

8. The active clamp circuit of claim 7, wherein the at least one positive differential path diode connected transistor, the at least one negative differential path diode connected transistor, the at least one first diode connected transistor and the at least one second diode connected transistor all comprise an equal number of transistors.

9. An active clamp circuit for an electronic component, the active clamp circuit comprising:
a positive input transistor adapted to pass an input signal on a positive differential path;
a negative input transistor adapted to pass the input signal on a negative differential path;
a differential output adapted to provide a differential voltage between the positive differential path and the negative differential path;
at least one first diode connected transistor electrically connected along a positive conductive path extending from the positive differential path to the negative differential path, the at least one first diode connected transistor configured to clamp the positive conducting path responsive to a positive differential voltage ($V_{outp}$) of the output being greater than a positive clamping voltage ($V_{clampp}$); and
at least one second diode connected transistor electrically connected along a negative conductive path extending from the negative differential path to the positive differential path, the at least one second diode connected transistor configured to clamp the negative conducting path responsive to a negative differential voltage ($V_{outn}$) of the output being less than that of a negative clamping voltage ($V_{clampn}$);
wherein the differential output is in electrical communication with an analog to digital converter (ADC) configured to generate a digital signal representative of a magnitude of a differential analog output signal from the differential output.

10. The active clamp circuit of claim 9, wherein the at least one first diode connected transistor comprises a plurality of first diode connected transistors connected in series, and the at least one second diode connected transistor comprises a plurality of second diode connected transistors connected in series.

11. The active clamp circuit of claim 9, wherein the positive clamping voltage ($V_{clampp}$) equals a sum of turn-on voltages ($V_{Be}$) of the first diode connected transistors.

12. The active clamp circuit of claim 9, wherein the negative clamping voltage ($V_{clampn}$) equals a sum of turn-on voltages ($V_{Be}$) of the second diode connected transistors.

13. The active clamp circuit of claim 9, wherein the electronic component comprises a differential amplifier.

14. The active clamp circuit of claim 9, further comprising an external attenuator electrically connected to the differential output.

15. An emitter follower buffer for an electronic component, the emitter follower buffer comprising:
a positive input transistor adapted to pass an input signal on a positive differential path;
a negative input transistor adapted to pass the input signal on a negative differential path;
a differential output adapted to provide a differential voltage between the positive differential path and the negative differential path;
a first set comprising a plurality of first diode connected transistors electrically connected in series along a positive conductive path extending from the positive differential path to the negative differential path, the first set configured to clamp the positive conducting path responsive to a positive differential voltage ($V_{outp}$) of the output being greater than a positive clamping voltage ($V_{clampp}$); and
a second set comprising a plurality of second diode connected transistors electrically connected in series along a negative conductive path extending from the negative differential path to the positive differential path, the second set configured to clamp the negative conducting path responsive to a negative differential voltage ($V_{outn}$) of the output being less than that of a negative clamping voltage ($V_{clampn}$);
wherein the positive clamping voltage ($V_{clampp}$) is dependent on a number of the first diode connected transistors;
wherein the negative clamping voltage ($V_{clampn}$) is dependent on a number of the second diode connected transistors; and
wherein the differential output is in electrical communication with an analog to digital converter (ADC) configured to generate a digital signal representative of a magnitude of a differential analog output signal from the differential output.

16. The emitter follower buffer of claim 15, wherein the positive clamping voltage ($V_{clampn}$) is set at a predetermined voltage greater than or equal to a sum of turn-on voltages ($V_{Be}$) of the first diode connected transistors.

17. The emitter follower buffer of claim 15, wherein the negative clamping voltage ($V_{clampn}$) is set at a predetermined voltage greater than or equal to a sum of turn-on voltages ($V_{Be}$) of the second diode connected transistors.

18. The emitter follower buffer of claim 15, wherein the first diode connected transistors and the second diode connected transistors comprise NPN transistors having their bases shorted to their drains.

19. The emitter follower buffer of claim 15, wherein the first diode connected transistors and the second diode connected transistors are connected emitter to collector.

20. The emitter follower buffer of claim 15 further comprising:
- a set of positive differential path diode connected transistors adapted to shift down a first voltage along the positive differential path; and
- a set of negative differential path diode connected transistors adapted to shift down a second voltage along the negative differential path.

21. The emitter follower buffer of claim 20, wherein the first set of the plurality of first diode connected transistors, the second set of the plurality of second diode connected transistors, the set of positive differential path diode connected transistors, and the set of negative differential path diode connected transistors all comprise an equal number of transistors.

22. The emitter follower buffer of claim 15, further comprising:
- a positive differential path bias source in electrical communication with the first set of the plurality of first diode connected transistors; and
- a negative differential path bias source in electrical communication with the second set of the plurality of first diode connected transistors.

23. The emitter follower buffer of claim 15 further comprising an external attenuator electrically connected to the differential output.

24. The emitter follower buffer of claim 15 wherein the first set and the second set of diode connected transistors limit RE energy incident to the analog to digital converter (ADC).

25. A receiver comprising:
- an analog to digital converter (ADC) configured to convert a differential output signal to a digital signal representative of a magnitude of the differential output signal; and
- an emitter follower buffer comprising:
  - a positive input transistor adapted to pass an input signal on a positive differential path;
  - a negative input transistor adapted to pass the input signal on a negative differential path;
  - a differential output terminal in electrical communication with the analog to digital converter and adapted to provide the differential output signal between the positive differential path and the negative differential path to the analog to digital converter;
  - a first set comprising a plurality of first diode connected transistors electrically connected in series along a positive conductive path extending from the positive differential path to the negative differential path, the first set configured to clamp the positive conducting path responsive to a positive differential voltage ($V_{outp}$) of the output terminal being greater than a positive clamping voltage ($V_{clampp}$); and
  - a second set comprising a plurality of second diode connected transistors electrically connected in series along a negative conductive path extending from the negative differential path to the positive differential path, the second set configured to clamp the negative conducting path responsive to a negative differential voltage ($V_{outn}$) of the output terminal being less than that of a negative clamping voltage ($V_{clampn}$);
  - the positive clamping voltage ($V_{clampp}$) being dependent on a number of the second diode connected transistors and the negative clamping voltage ($V_{clampn}$) being dependent on a number of the second diode connected transistors.

26. The receiver of claim 25 further comprising an external attenuator electrically connected to the output terminal.

27. The receiver of claim 25, wherein the receiver comprises a radar receiver.

28. The receiver of claim 25, wherein the receiver comprises a radio receiver.

29. The receiver of claim 25, wherein the receiver further comprises a mixer configured to convert a high radio frequency signal to an intermediate radio frequency signal that comprises the input signal to the emitter follower buffer.

30. The receiver of claim 25, wherein the receiver further comprises a digital signal processor coupled to the analog to digital converter.

31. The receiver of claim 30, wherein the receiver further comprises a mixer configured to convert a high radio frequency signal to an intermediate radio frequency signal that comprises the input signal to the emitter follower buffer.

32. The receiver of claim 25, wherein the input signal is a radio frequency signal comprising at least one radar pulse.

* * * * *

UNITED STATES PATENT AND TRADEMARK OFFICE
CERTIFICATE OF CORRECTION

PATENT NO. : 7,724,061 B2
APPLICATION NO. : 11/981196
DATED : May 25, 2010
INVENTOR(S) : Won Chon et al.

It is certified that error appears in the above-identified patent and that said Letters Patent is hereby corrected as shown below:

Column 9, Claim 24, line 28         Delete "RE" Insert -- RF --

Signed and Sealed this
Twenty-seventh Day of September, 2011

David J. Kappos
*Director of the United States Patent and Trademark Office*